United States Patent [19]

Yamaguchi

[11] 3,988,597

[45] Oct. 26, 1976

[54] TIME CORRECTION CIRCUITS FOR ELECTRONIC TIMEPIECES

[75] Inventor: Tetsuo Yamaguchi, Yokohama, Japan

[73] Assignee: Tokyo Shibaura Electric Co., Ltd., Kawasaki, Japan

[22] Filed: Nov. 20, 1975

[21] Appl. No.: 633,688

[30] Foreign Application Priority Data

Jan. 31, 1975 Japan .............................. 50-12373

[52] U.S. Cl. ............................ 307/247 A; 58/23 R; 58/85.5

[51] Int. Cl.[2] .................. H03K 17/28; H03K 17/16; H03K 17/02

[58] Field of Search ................ 58/23 A, 23 R, 85.5, 58/50 R; 307/247 A

[56] References Cited

UNITED STATES PATENTS

| | | | |
|---|---|---|---|
| 3,672,155 | 6/1972 | Bergey et al. | 58/50 R |
| 3,721,833 | 3/1973 | Kramer | 307/247 A |
| 3,743,860 | 7/1973 | Rossell | 307/247 A |
| 3,765,163 | 10/1973 | Levine et al. | 58/50 R |
| 3,786,625 | 1/1974 | Sauthier | 58/85.5 |
| 3,852,951 | 12/1974 | Sauthier | 58/23 R |
| 3,889,460 | 6/1975 | Yasukawa et al. | 58/50 R |

*Primary Examiner*—John S. Heyman
*Attorney, Agent, or Firm*—Oblon, Fisher, Spivak, McClelland & Maier

[57] ABSTRACT

The time correction circuit comprises a first shift register circuit including two cascade connected shift registers which are driven by a 1 Hz clock pulse and a switch opened and closed to apply an electric signal to the first register circuit. There are provided a first AND gate circuit connected to receive the output from the first register circuit and the signal produced by the operation of the switch, and a second AND gate circuit connected to receive the output from the first AND gate circuit and a 1 Hz clock pulse for producing a 1 Hz clock pulse when the switch is maintained in the closed state for more than 2 seconds. The switch is also connected to the set terminal of a flip-flop circuit having an output terminal connected to the input terminal of a second shift register circuit including two cascade connected shift registers driven by the 1 Hz clock pulse. The output from the flip-flop circuit is applied to the input terminal of a shift register driven by a clock pulse having a frequency of 32 Hz. Upon receiving the output from the second shift register circuit the last mentioned shift register generates an output which resets the respective shift registers of the second shift register circuit and the flip-flop circuit. Further the output from the second flip-flop circuit and the inverted signal of the output from the first AND gate circuit are applied to a third AND gate circuit for producing a pulse when the switch is maintained closed for less than 2 seconds and then opened.

8 Claims, 25 Drawing Figures

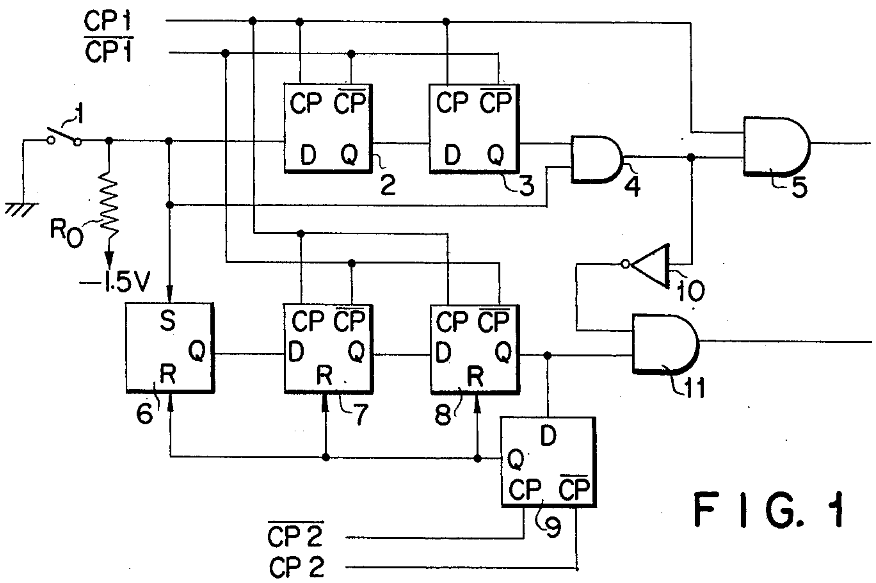
FIG. 1
FIG. 2A
FIG. 2B
FIG. 2C
FIG. 2D
FIG. 2E
FIG. 2F
FIG. 2G
FIG. 2H
FIG. 2I
FIG. 2J
FIG. 2K
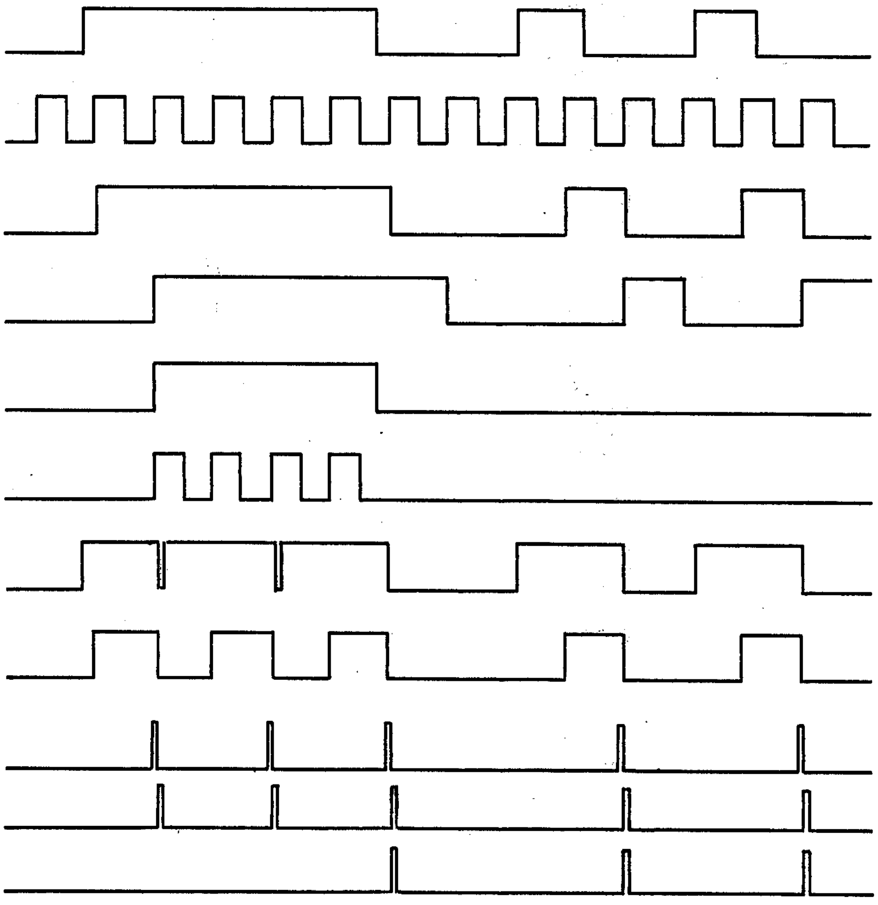

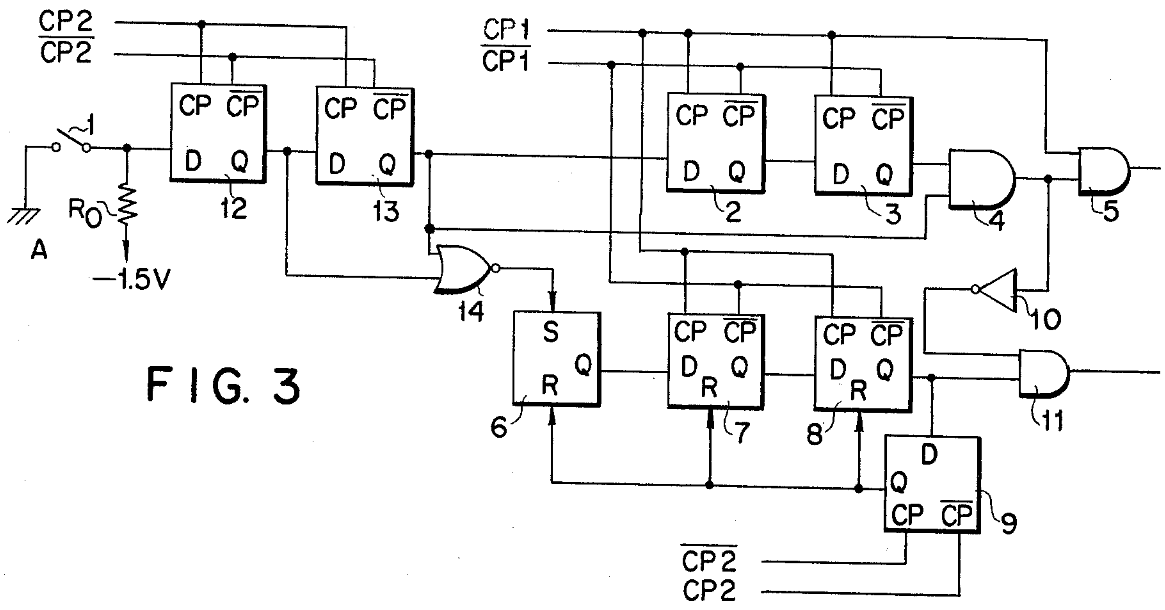
FIG. 3
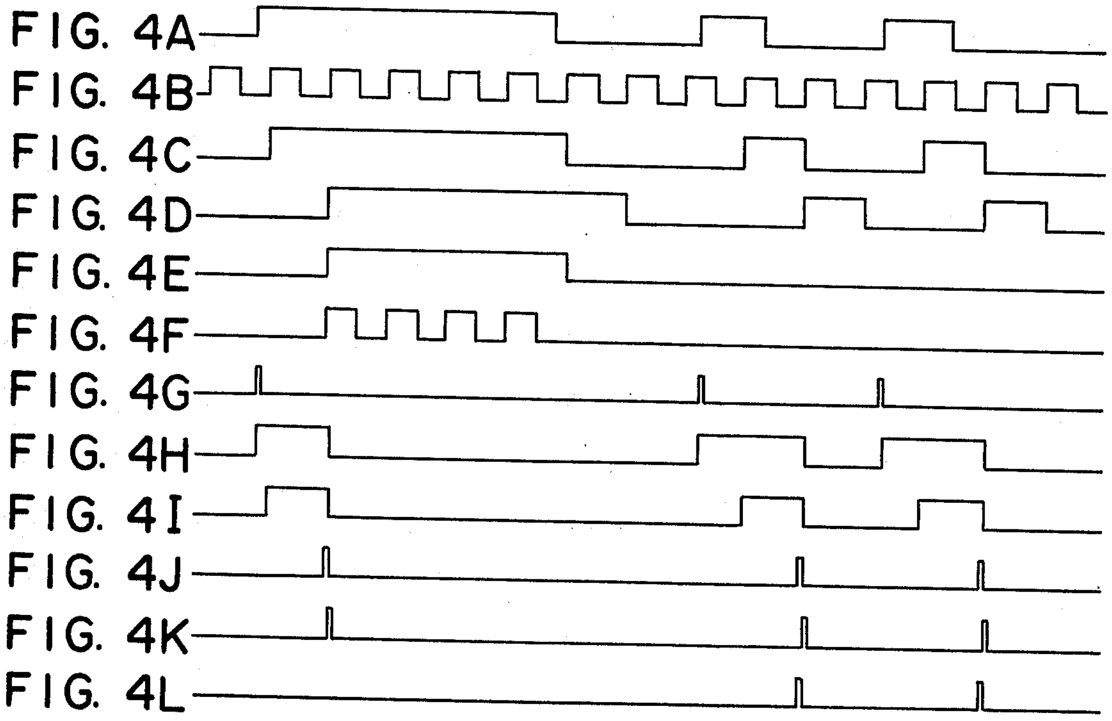

TIME CORRECTION CIRCUITS FOR ELECTRONIC TIMEPIECES

BACKGROUND OF THE INVENTION

This invention relates to a time correcting circuit for an electronic timepiece, and more particularly to a time and date correcting circuit of an electronic timepiece.

With recent advance in high density integrated circuits conventional mechanical timepieces have been gradually replaced by electronic timepieces. Electronic timepieces are classified into a register type and a frequency division type. However, both types involve troublesome problems of time correction. In the past, various methods of time correction have been proposed. In one example, an electric signal is produced by closing and opening a mechanical switch and the electric signal is applied to an electronic circuit for producing a digital signal which is applied directly or indirectly to a closed loop circuit or a frequency division circuit which is constituted by transistors, etc., for correcting hour, minute, second and date. In a mechanical switch the interval of chattering occurring at the time of switching operation varies dependent upon the mechanism and materials utilized for the switch. Switches in which the chattering interval is limited to be less than 30 milliseconds are expensive whereas the accuracy of the electronic timepiece utilizing a switch having a chattering period of more than 30 milliseconds is low. For this reason, the chattering interval is generally set to about 30 milliseconds.

Where a mechanical switch is used, time correction is performed by continuously depressing the switch for continuously generating an electric pulse or by intermittently closing and opening the switch for intermittently generating an electric pulse and by utilizing such pulses as time correcting signals. However, when correcting the date or hour, the method of continuously depressing the switch is not suitable for correcting a small error whereas the method of intermittently depressing the switch is troublesome to correct a large error because it is necessary to depress the switch many times.

SUMMARY OF THE INVENTION

It is an object of this invention to provide a novel time correction circuit for an electronic timepiece which makes it possible to readily correct the time in a short time by providing a first signal generating circuit which generates a continuous pulse utilized as a correction signal when the switch is depressed continuously over a predetermined interval and a second signal generating circuit which generates a pulse signal when the switch is depressed for an interval shorter than the predetermined interval.

Another object of this invention is to provide a simple time correction circuit for an electronic timepiece that can correct in a short time the hour, minute, second and date displays of the timepiece by means of a single control switch.

According to this invention, there is provided a time correction circuit for an electronic timepiece, comprising a switch, a first signal generating circuit including a first shift register circuit composed of a plurality of serially connected shift registers which are driven by a clock pulse having a first predetermined frequency for shifting an electric signal produced by the operation of the switch, said first signal generating circuit producing a continuous signal when the switch is operated for more than a predetermined interval, and a second pulse generating circuit including a second shift register circuit composed of a plurality of serially connected shift registers which are driven by a clock pulse having a second predetermined frequency for shifting an electric signal produced by the operation of the switch, said second pulse generating circuit producing a pulse signal when the switch is operated for an interval shorter than the predetermined interval.

BRIEF DESCRIPTION OF THE DRAWING

FIG. 1 is a block diagram of one example of the novel time correction circuit according to this invention for use in an electronic timepiece;

FIGS. 2A through 2K show signal waveforms at various portions of the circuit shown in FIG. 1;

FIG. 3 is a block diagram showing a modified embodiment according to this invention; and FIGS. 4A through 4L show signal waveforms at various portions of the circuit shown in FIG. 3.

DETAILED DESCRIPTION OF THE PREFERRED EMBODIMENTS

A preferred embodiment of this invention shown in FIG. 1 comprises a switch 1 having one terminal grounded, and a first shift register circuit including serially connected shift registers 2 and 3 connected to the other terminal of the switch 1. To the juncture between the switch 1 and the shift register 2 a voltage of $-1.5$V is applied through a resistor $R_0$ so that upon closure of switch 1 a voltage of $-1.5$V is impressed upon the input terminal D of shift register 2. Each one of the shift registers 2 and 3 is driven by clock pulses CP1 and $\overline{CP1}$ each having a frequency of 1 Hz for shifting the input signal. The input terminal D of the shift register 2 and the output terminal Q of the shift register 3 are connected to the input terminals of an AND gate circuit 4. The output from this AND gate circuit 4 is applied to one input terminal of an AND gate circuit 5 having the other input terminal connected to receive the clock pulse CP1 of 1 Hz. Shift registers 2 and 3 and the AND gate circuits 4 and 5 constitute a first signal generating circuit which generates a clock pulse of 1 Hz when switch 1 is closed for a length of time longer than a value lying between 1 and 2 seconds. An output from the first signal generating circuit is applied to a counter, not shown, of an electronic timepiece to form a time correction signal.

There is provided a flip-flop circuit 6 whose set terminal S is connected to the righthand terminal of switch 1, so that when switch 1 is closed the flip-flop circuit 6 is set. The flip-flop circuit is of the reset preferential type and its output terminal Q is connected to the input terminal D of a shift register 7, which constitutes a second shift register circuit together with a shift register 8 connected in series therewith. Like shift registers 2 and 3, shift registers 7 and 8 are also driven by clock pulses CP1 and $\overline{CP1}$ each having a frequency of 1 Hz. The output terminal Q of the shift register 8 is connected to the input terminal D of a shift register 9 connected to be driven by clock pulses CP2 and $\overline{CP2}$ each having a frequency of 32 Hz. The output terminal Q of the shift register 9 is connected to the reset terminals R of flip-flop circuit 6 and shift registers 7 and 8. The output terminal Q of the shift register 8 is connected to the second input terminal of an AND gate circuit 11, the first input terminal thereof being connected to the output terminal of the AND gate circuit 4 via an inverter 10. Flip-flop circuit 6, shift registers 8 and 9 and AND gate circuit 11 constitute a second signal generating circuit which produces a pulse when the switch 1 is closed for a length of time shorter than a value lying between 1 and 2 seconds.

The operation of the time correction circuit shown in FIG. 1 will now be described with reference to FIGS. 2A through 2K.

Consider now a case wherein switch 1 is operated to generate an electric signal as shown in FIG. 2A. This signal is impressed upon shift register 2 and when switch 1 is closed, at an instant immediately after the electric signal has charged to a high level the closure of the switch 1 is detected by the positive going transition of the 1 Hz clock pulse shown in FIG. 2B. On the other hand, when the switch 1 is opened, the opening of the switch 1 is detected by the positive going transition of the clock pulse immediately following the charge of the signal to a low level. In this manner, register 2 produces a signal shown by FIG. 2C. This output signal from shift register 2 is shifted by shift register 3 in the same manner, thus producing a signal shown by FIG. 2D. The signal shown by FIG. 2E represents the output signal produced from AND gate circuit 4 when it receives the signals shown by FIG. 2A and FIG. 2C. This output signal is applied to AND gate circuit 5 so that AND gate circuit 5 is enabled or opened when the signal shown by FIG. 2E is at the high level to pass the 1 Hz clock pulse thereby producing a signal as shown by FIG. 2F. The signal shown in FIG. 2A is also applied to the set terminal S of flip-flop circuit 6 whereby this flipflop circuit 6 is set and produces a high level output as shown by FIG. 2G on its output terminal Q. In response to this output the shift register 7 produces a high level signal shown by FIG. 2H which builds up with substantially the same timing as the output signal of the shift register 2. In response to the high level output from shift register 7, the shift register 8 shifts this signal with a delay time of one second to produce an output signal as shown in FIG. 2I which is applied to shift register 9. Accordingly, the shift register 9 produces a reset signal as shown in FIG. 2J on its output terminal Q which is delayed less than one thirty-second second with respect to the output signal from the shift register 8. This output signal is used to reset shift register 8 to change the output thereof to the low level. Consequently the output signal of the shift register 9 too is changed to the low level with the result that shift register 9 produces a pulse having a width of about one sixty-fourth sec. as a reset signal. This reset signal is applied to the flip-flop circuit 6 to reset the same. In this case, if switch 1 is open, flip-flop circuit 6 will be maintained in the reset state, whereas if the switch 1 is closed, the flip-flop circuit 6 will be set again after one sixty-fourth second thus causing shift register 8 to again produce a pulse. In this manner, the pulse produced by this shift register 8 (see FIG 2J) is applied to one input of AND gate circuit 11, the other input thereof receiving the inverted signal of the output from AND gate circuit 4. Accordingly, when AND gate circuit 4 produces a high level output, the output from shift register 8 is blocked and the output signal of the AND gate circuit 11 is maintained at the low level. On the other hand, when the output from AND gate circuit 4 is at the low level, AND gate circuit 11 will produce a pulse as shown in FIG. 2K.

Let us consider a case wherein the output terminal of AND gate circuit 5 is connected to a 10 minute counting circuit (not shown) of the timepiece, and the ouput terminal of the AND gate circuit 11 is connected to a one minute counting circuit for correcting the minute display. For example, in order to advance the minute digit by 56 minutes, switch 1 is maintained closed for about 6 to 7 seconds to step the 10 minute counting circuit by 5, that is, to advance the minute digit by 50 minutes and then intermittently close the switch 1 several times each for less than 1 minute to set the minute digit to 6. According to the prior art correction circuit this correction operation requires more than 50 seconds whereas according to the novel correction circuit it takes only 10 to 30 seconds.

When the output terminal of the AND gate circuit 5 is connected to a minute counting circuit of the timepiece and when the output terminal of the AND gate circuit 11 is connected to an hour counting circuit it is possible to set two time digits by closing the switch 1 for a length of time longer than a value lying between 1 and 2 seconds or by closing it for less than 1 second.

Thus, according to this invention, it is possible to readily and rapidly correct the time by operating a single switch.

FIG. 3 shows a modified embodiment of the time correction circuit in which two serially connected shift registers 12 and 13 driven by clock pulses CP2 and $\overline{CP2}$ each having a frequency of 32 Hz and a NOR gate circuit 14 with two input terminals connected to the respective outputs of the shift registers 12 and 13 are added to the circuit shown in FIG. 1. Addition of NOR gate circuit 14 eliminates the effect of the chattering of the switch 1 persisting for less than 31.25 milliseconds. Further, as the flip-flop circuit 6 is set by the one-shot input from the NOR gate circuit 14 the shift register 8 produces only one pulse for each closure of the switch so that when the AND gate circuit 4 produces the clock pulse CP1, the AND gate circuit 11 is prohibited from producing an output. For this reason, it is possible to independently control two time digits.

Suppose now that a signal shown by FIG. 4A is applied by switch 1. Then the shift register 13 shifts this signal by one sixty-fourth to one thirty-second second so that the outputs from shift registers 2 and 3, AND gate circuits 4 and 5 have the waveforms as shown in FIGS. 4C, 4D, 4E and 4F respectively like the circuit shown in FIG. 1. As shown in FIG. 4G, the NOR gate circuit 14 produces one pulse each time the switch 1 is closed. The flip-flop circuit 6 is reset by this pulse and set after 1 to 2 seconds like the circuit shown in FIG. 1. When reset, the input to the set terminal S of the flip-flop circuit 6 is at the low level, the flip-flop circuit will not be set again. The waveforms of the outputs from the flip-flop circuit 6 and shift registers 8 and 9 are shown by FIGS. 4H to 4K, respectively. Due to the presence of inverter 10, the output from shift register 8 passes through AND gate circuit 11 when the output shown by FIG. 4D is at the low level.

In this modification, when the switch 1 is closed for 1 to 2 seconds or more, the 1 Hz signal passes through AND gate circuit 5 but AND gate circuit 11 does not produce an output. On the other hand, when the switch 1 is maintained closed for an interval of less than 1 second, AND gate circuit 11 produces a single pulse.

In this manner, by depressing the switch for different intervals it is possible to independently control or correct two time digits.

While the invention has been shown and described in terms of a preferred embodiment it should be understood that the invention is not limited to this embodiment. For example, by connecting another shift register in series with shift registers 2 and 3 it is possible to produce a series of pulses from AND gate circuit 5 by closing switch 1 for a length of time longer than a value lying between 2 and 3 seconds.

What is claimed is:

1. A time correction circuit for an electronic timepiece, comprising a switch, a first pulse generating circuit including a first shift register circuit constituted by a plurality of serially connected shift registers which are driven by a clock pulse having a first predetermined frequency for shifting an electric signal produced by the operation of said switch, said first pulse generating circuit producing a series of pulses when said switch is operated for more than a predetermined interval, and a second pulse generating circuit including a second shift register circuit composed of a plurality of serially connected shift registers which are driven by a clock pulse having a second predetermined frequency for shifting an electric signal produced by the operation of said switch, said second pulse generating circuit producing a pulse signal when said switch is operated for an interval shorter than said predetermined interval.

2. The time correction circuit according to claim 1 wherein said first signal generating circuit comprises a first logic circuit effecting logical product operation and having two input terminals respectively connected to the input and output terminals of said first shift register circuit and a second logic circuit effecting logical product operation and connected to receive the output signal from said first AND logic circuit and a clock pulse having a third predetermined frequency.

3. The time correction circuit according to claim 2 wherein said first shift register circuit comprises two shift registers.

4. The time correction circuit according to claim 2 wherein each one of said first and second logic circuits comprises an AND gate circuit.

5. The time correction circuit according to claim 1 wherein the first shift register circuit of said first signal generating circuit comprises two shift registers, and wherein said second signal generating circuit also comprises two shift registers.

6. The time correction circuit according to claim 5 wherein said first signal generating circuit further comprises a first AND gate circuit having input terminals connected to the input and output terminals of said first shift register circuit, and a second AND gate circuit connected to receive the output signal from said first AND gate circuit and a clock pulse having said third predetermined frequency, and wherein said second signal generating circuit further comprises an additional shift register driven by a clock pulse having a fourth predetermined frequency and connected to receive the output signal from said second shift register circuit for producing a reset signal applied to respective shift registers of said second shift register circuit, and a third AND gate circuit connected to receive the inverted signal of the output signal from said first AND gate circuit.

7. The time correction circuit according to claim 6 wherein said second signal generating circuit further comprises a reset circuit including a set terminal connected to receive an electric signal generated by the operation of said switch and a reset terminal connected to receive the output signal from said shift register circuit that generates said reset signal, said reset circuit providing its output signal to said second shift register.

8. The time correction circuit according to claim 1 which further comprises a pair of shift registers which are driven by the clock pulse having said second predetermined frequency and connected in series between said switch and said first signal generating circuit and a NAND gate circuit having two inputs connected to the outputs of said pair of shift registers respectively and an output connected to said second pulse generating circuit.

* * * * *

UNITED STATES PATENT AND TRADEMARK OFFICE
CERTIFICATE OF CORRECTION

PATENT NO. : 3,988,597

DATED : October 26, 1976

INVENTOR(S) : Tetsuo Yamaguchi

It is certified that error appears in the above–identified patent and that said Letters Patent are hereby corrected as shown below:

Claim 2, line 8, delete "AND".

Signed and Sealed this

Twenty-second Day of March 1977

[SEAL]

*Attest:*

RUTH C. MASON
*Attesting Officer*

C. MARSHALL DANN
*Commissioner of Patents and Trademarks*